(12) United States Patent　　　　　(10) Patent No.:　US 12,696,473 B2
Sandupatla et al.　　　　　　　　　　(45) Date of Patent:　　　Jul. 28, 2026

(54) HIGH-ELECTRON-MOBILITY TRANSISTORS WITH ACTIVE BLOCKS

(71) Applicant: GlobalFoundries U.S. Inc., Malta, NY (US)

(72) Inventors: Abhinay Sandupatla, Leuven (BE); Bartlomiej Jan Pawlak, Leuven (BE)

(73) Assignee: GlobalFoundries U.S. Inc., Malta, NY (US)

( * ) Notice: Subject to any disclaimer, the term of this patent is extended or adjusted under 35 U.S.C. 154(b) by 105 days.

(21) Appl. No.: 18/912,129

(22) Filed: Oct. 10, 2024

(65) Prior Publication Data

US 2026/0122948 A1　　Apr. 30, 2026

(51) Int. Cl.
| *H10D 30/47* | (2025.01) |
| *H10D 30/01* | (2025.01) |
| *H10D 62/824* | (2025.01) |
| *H10D 64/00* | (2025.01) |

(52) U.S. Cl.
CPC ......... *H10D 30/475* (2025.01); *H10D 30/015* (2025.01); *H10D 64/112* (2025.01); *H10D 62/824* (2025.01)

(58) Field of Classification Search
CPC .. H10D 30/475; H10D 30/015; H10D 64/112; H10D 62/824
See application file for complete search history.

(56) References Cited

U.S. PATENT DOCUMENTS

| 2008/0073670 A1* | 3/2008 | Yang | H10D 30/4755 |
| | | | 257/E29.253 |
| 2011/0221011 A1* | 9/2011 | Bahat-Treidel | H10D 64/112 |
| | | | 257/E21.54 |
| 2021/0013336 A1* | 1/2021 | Jeon | H10D 64/257 |
| 2024/0282827 A1* | 8/2024 | Zuniga | H10D 64/111 |

OTHER PUBLICATIONS

Sandupatla, Abhinay et al., "High-Electron-Mobility Transistors With Inactive Gate Blocks" filed on Jul. 11, 2024 as a U.S. Appl. No. 18/769,902.

Sanyam Bajaj et al., "Simulation of Enhancement Mode GaN HEMTs with Threshold > 5 V using P-type Buffer." Physics arXiv:1511.04438; https://doi.org/10.48550/arXiv.1511.04438.

G. Zhou et al., "Gate Leakage Suppression and Breakdown Voltage Enhancement in p-GaN HEMTs Using Metal/Graphene Gates," in IEEE Transactions on Electron Devices, vol. 67, No. 3, pp. 875-880, Mar. 2020, doi: 10.1109/TED.2020.2968596.

Mahaboob, Isra et.al. "Dynamic Control of AlGaN/GaN HEMT Characteristics by Implementation of a p-GaN Body-diode based Back-gate", IEEE Jeds. pp. 1-1. 10.1109/JEDS.2019.2915097.

(Continued)

*Primary Examiner* — Peniel M Gumedzoe
(74) *Attorney, Agent, or Firm* — Thompson Hine LLP; Francois Pagette

(57)　　　　ABSTRACT

Structures for a high-electron-mobility transistor and methods of forming such structures. The structure comprises a device structure that includes a gate and an ohmic contact, and one or more active blocks that are laterally positioned between the gate and the ohmic contact. The one or more active blocks are configured to receive a supply voltage that is different from ground.

20 Claims, 6 Drawing Sheets

(56) References Cited

OTHER PUBLICATIONS

D.-J. Lin, J.-Y. Yang, C.-K. Chang and J.-J. Huang, "Study of Current Collapse Behaviors of Dual-Gate AlGaN/GaN HEMTs on Si," in IEEE Journal of the Electron Devices Society, vol. 10, pp. 59-64, 2022, doi: 10.1109/JEDS.2021.3132429.

U.S. Patent and Trademark Office; Non-Final Office Action issued in U.S. Appl. No. 18/769,902 on Aug. 30, 2024; 11 pages.

U.S. Patent and Trademark Office; Notice of Allowance issued in U.S. Appl. No. 18/769,902 on Oct. 1, 2024; 11 pages.

Chen, D., Yuan, P., Zhao, S. et al. "Wide-range-adjusted threshold voltages for E-mode AlGaN/GaN HEMT with a p-SnO cap gate." Science China Materials 65, 795-802 (2022). https://doi.org/10.1007/s40843-021-1838-3.

\* cited by examiner

HIGH-ELECTRON-MOBILITY TRANSISTORS WITH ACTIVE BLOCKS

STATEMENT REGARDING FEDERALLY SPONSORED RESEARCH OR DEVELOPMENT

This invention was made with government support under HQ0727790700 awarded by the Defense Microelectronics Activity. The government has certain rights in the invention.

BACKGROUND

The disclosure relates to semiconductor device fabrication and integrated circuits and, more specifically, to structures for a high-electron-mobility transistor and methods of forming such structures.

Compound semiconductors are characterized by advantageous material properties, such as a carrier mobility that is higher than the carrier mobility of silicon and a wider band gap than silicon, that can be exploited to fabricate device structures. Compound semiconductors may include, for example, Group III elements (e.g., aluminum, gallium, and/or indium) and Group V elements (e.g., nitrogen, phosphorus, arsenic, and/or antimony) combined with the Group III elements.

High-electron-mobility transistors based on compound semiconductors can be deployed in certain integrated circuit applications, such as high-voltage power electronics. A high-electron-mobility transistor may include a heterojunction between crystalline compound semiconductor materials having different band gaps, such as a heterojunction between binary gallium nitride and trinary aluminum-gallium nitride. During operation, a two-dimensional electron gas is formed near an interface at the heterojunction and defines the channel of the high-electron-mobility transistor.

A conventional high-electron-mobility transistor is characterized by multiple terminals, namely a gate, a source, and a drain. The gate is used to control carrier flow between the source and drain. A high-electron-mobility transistor may operate in a normally on-state because of the persistence of the two-dimensional electron gas, which requires a threshold voltage that is negative or zero to provide switching. Providing a positive threshold voltage represents a challenging undertaking.

Improved structures for a high-electron-mobility transistor and methods of forming such structures are needed.

SUMMARY

In an embodiment of the invention, a structure comprises a device structure that includes a gate and an ohmic contact, and one or more active blocks that are laterally positioned between the gate and the ohmic contact. The one or more active blocks are configured to receive a supply voltage that is different from ground.

In an embodiment of the invention, a method comprises forming a device structure that includes a gate and an ohmic contact and forming one or more active blocks that are laterally positioned between the gate and the ohmic contact. The one or more active blocks are configured to receive a supply voltage that is different from ground.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
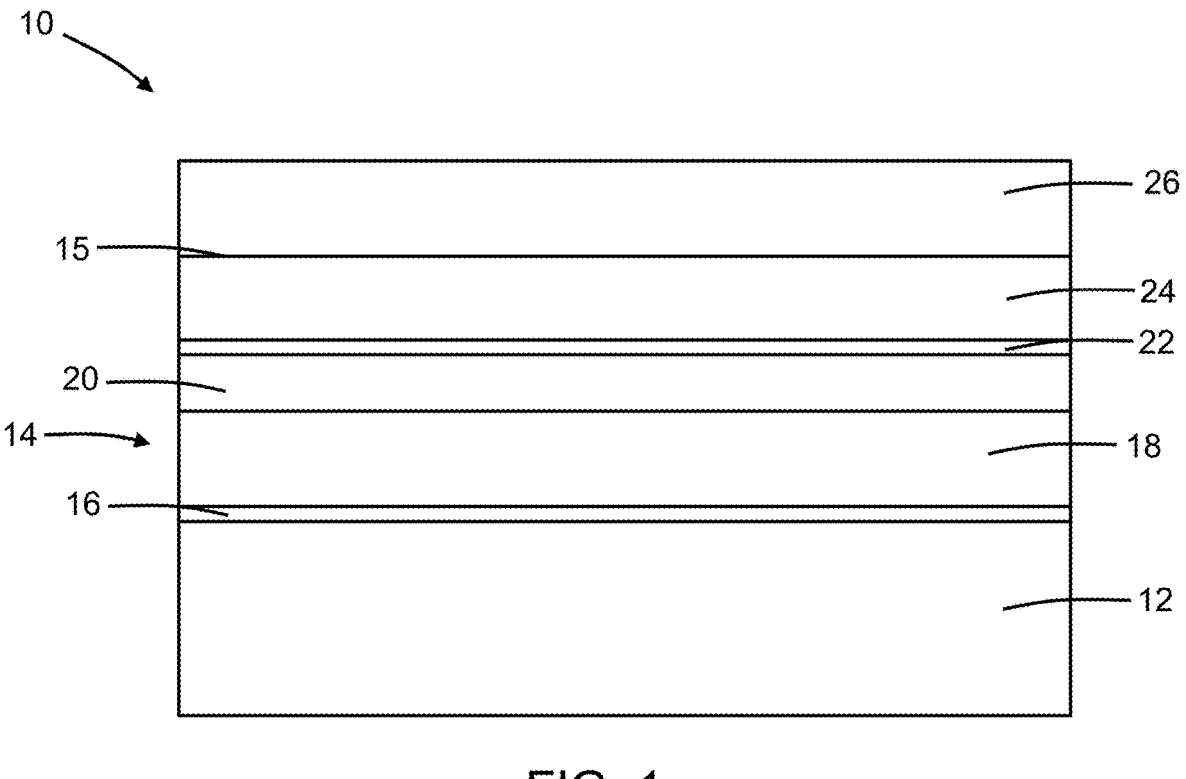
FIG. 1 is a cross-sectional view of a structure at an initial fabrication stage of a processing method in accordance with embodiments of the invention.

With reference to FIG. 1 and in accordance with embodiments of the invention, a structure 10 for a high-electron-mobility transistor may include a layer stack 14 that is formed on the top surface of a substrate 12. The substrate 12 may be comprised of a single-crystal semiconductor material, such as single-crystal silicon. The substrate 12 may be a bulk substrate that contains a single-crystal semiconductor material, such as single-crystal silicon. In an embodiment, the single-crystal semiconductor material of the substrate 12 may have a diamond crystal lattice structure with a <111> crystal orientation. The substrate 12 may be doped to have, for example, p-type conductivity. In alternative embodiments, the substrate 12 may be a different type of substrate, such as a sapphire substrate, an engineered substrate, a silicon-on-insulator substrate, a silicon carbide substrate, etc.

The layer stack 14 may include a seed layer 16, a buffer layer 18, a channel layer 20, a barrier layer 22, and a donor layer 24 each containing one or more compound semiconductor materials. The layers 16, 18, 20, 22, 24 may be serially deposited using an epitaxial growth process to form the layer stack 14. The layer stack 14 may have a thickness, for example, on the order of five (5) micrometers.

Each of the layers 16, 18, 20, 22, 24 of the layer stack 14 may have a crystal structure that is single crystal or, alternatively, a crystal structure that is substantially single crystal with varying levels of crystalline defectivity present. The seed layer 16, which provides a thin nucleation layer for the growth of the buffer layer 18, may be comprised of, for example, aluminum nitride. The buffer layer 18 may be comprised of one or more binary or ternary III-V compound semiconductor materials, such as aluminum gallium nitride, gallium nitride, aluminum nitride, or a layered combination of these materials. The buffer layer 18 is tailored in terms of material composition, doping, layering, and/or layer thickness to accommodate lattice mismatch, thermal property differences, and mechanical property differences between the material of the substrate 12 and the material of the channel layer 20. The channel layer 20, which is positioned between the buffer layer 18 and the barrier layer 22, may be comprised of a binary III-V compound semiconductor material, such as gallium nitride. The channel layer 20 may include a sublayer comprised of undoped gallium nitride adjacent to the barrier layer 22 and a sublayer comprised of doped gallium nitride adjacent to the buffer layer 18. The barrier layer 22, which is positioned between the channel layer 20 and the donor layer 24, may be comprised of a binary III-V compound semiconductor material, such as aluminum nitride, and the material of the barrier layer 22 may be characterized by a higher electrical resistivity than the material of the channel layer 20 or the material of the donor layer 24. The donor layer 24, which is positioned on the barrier layer 22, may contain a ternary III-V compound semiconductor, such as aluminum gallium nitride. During operation of the high-electron-mobility transistor, a two-dimensional electron gas is formed in the channel layer 20 near the interface with the barrier layer 22.

A semiconductor layer 26 may be formed on the donor layer 24 at the top surface 15 of the layer stack 14. The semiconductor layer 26 may be comprised of a doped III-V compound semiconductor material, such as gallium nitride containing a concentration of a p-type dopant, having a crystal structure that is either single crystal or substantially single crystal. The semiconductor layer 26 may be deposited using an epitaxial growth process.

Figure 2:
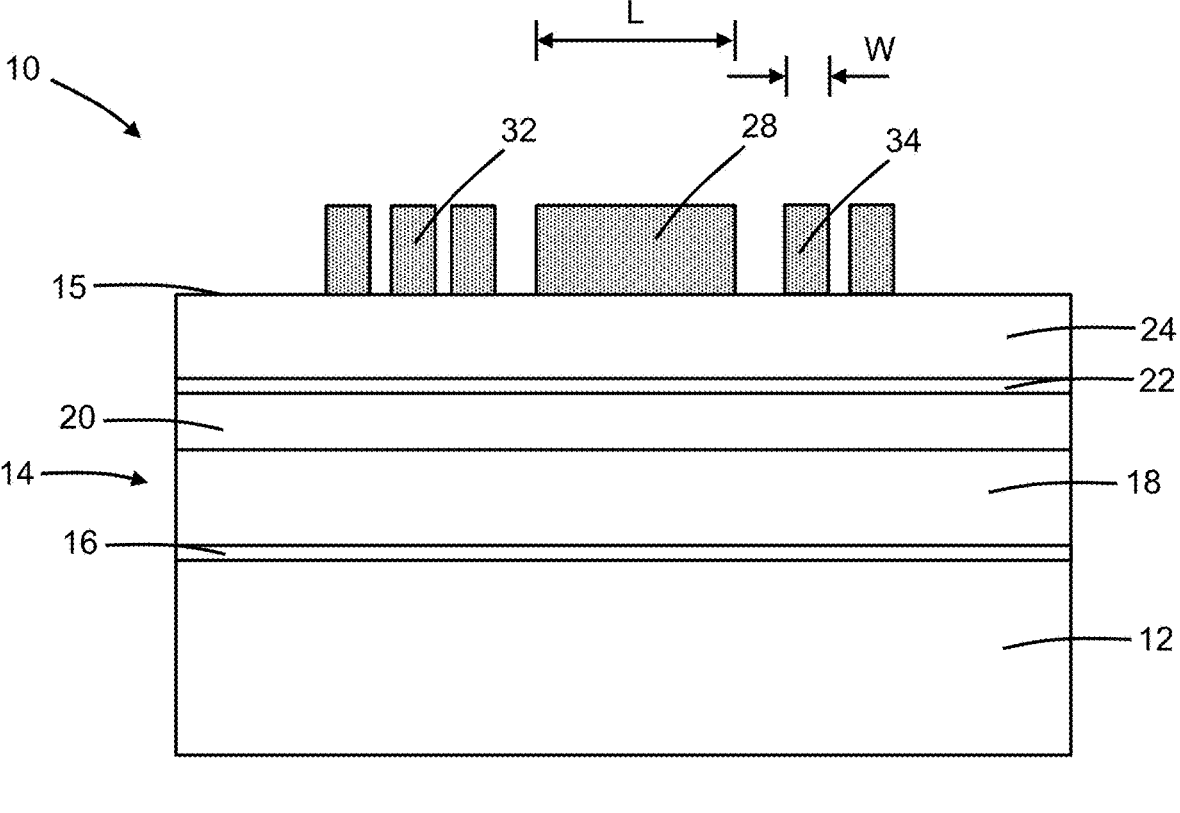
FIG. 2 is a cross-sectional view of the structure at a fabrication stage subsequent to FIG. 1.

With reference to FIG. 2 in which like reference numerals refer to like features in FIG. 1 and at a subsequent fabrication stage, the semiconductor layer 26 may be patterned by lithography and etching processes to define a gate 28, one or more active blocks 32, and one or more active blocks 34 that may be positioned on the top surface 15 of the layer stack 14. In an embodiment, the gate 28 and the active blocks 32, 34 may directly contact the top surface 15 of the layer stack 14. In an alternative embodiment, the gate 28 may be positioned in a recess extending into the top surface 15 of the layer stack 14. The active blocks 32 and the active blocks 34 are positioned adjacent to opposite sides of the gate 28 such that the gate 28 is laterally positioned between the active blocks 32 and the active blocks 34. In an embodiment, the active blocks 32, 34 may be comprised of the doped III-V compound semiconductor material of the semiconductor layer 26.

The active blocks 32, 34 may have a width W, and the gate 28 may have a gate length L. In an embodiment, the gate length L of the gate 28 may be greater than the width W of the active blocks 32, 34. In an embodiment, the active blocks 32 and/or the active blocks 34 may have equal widths W. In an alternative embodiment, some or all of the active blocks 32 and/or some or all of the active blocks 34 may have unequal widths W. In an embodiment, the active blocks 32, 34 may have equal thicknesses T. In an embodiment, the active blocks 32, 34 and the gate 28 may have equal thicknesses T. In an embodiment, the active blocks 32, 34 may be bars with respective lengths that are greater than their widths W and their thicknesses T. In an embodiment, the active blocks 32, 34 may be fingers that may be joined at one end and that may have respective lengths that are greater than their widths W or their thicknesses T.

In an embodiment, the gate 28 and the active blocks 32, 34 may be concurrently patterned from the doped III-V compound semiconductor material of the semiconductor layer 26. In an embodiment, the gate 28 and the active blocks 32, 34 may have the same dopant concentration. In an alternative embodiment, the active blocks 32, 34 may be patterned from a different layer of doped III-V compound semiconductor material than the semiconductor layer 26 used to form the gate 28, which may permit the gate 28 and the active blocks 32, 34 to have different dopant concentrations.

In an embodiment, the number of active blocks 32 may differ from the number of active blocks 34 such that the arrangement of the active blocks 32, 34 is asymmetrical about the gate 28. In an alternative embodiment, the number of active blocks 32 may be equal to the number of active blocks 34 such that the arrangement of the active blocks 32, 34 is symmetrical about the gate 28. In an alternative embodiment, only the active blocks 32 may be present. In an alternative embodiment, only the active blocks 34 may be present.

In an alternative embodiment, the active blocks 32, 34 may be comprised of one or more metals, such as nickel, gold, titanium, aluminum, or tungsten, and may be in direct contact with portions of the top surface 15 of the layer stack 14 to define Schottky contacts.

Figure 3:
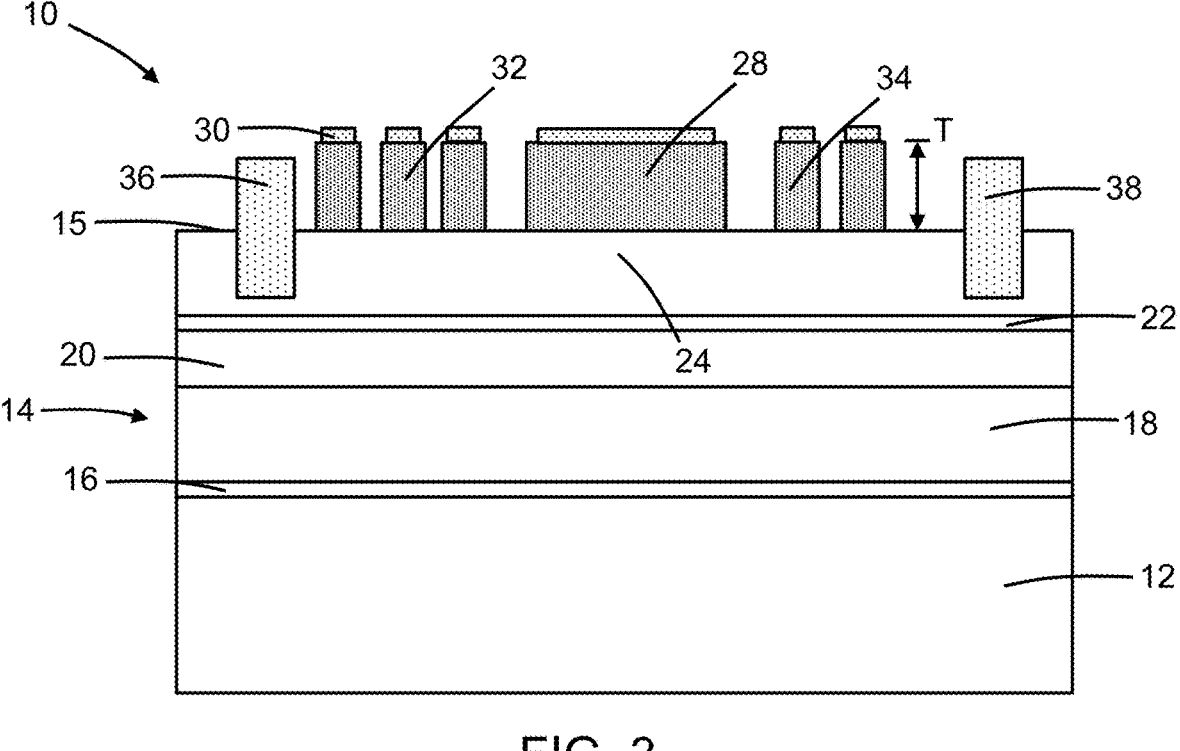
FIG. 3 is a cross-sectional view of the structure at a fabrication stage subsequent to FIG. 2.

With reference to FIG. 3 in which like reference numerals refer to like features in FIG. 2 and at a subsequent fabrication stage, a metal layer 30 comprised of, for example, titanium nitride may be formed on the top surface of the gate 28 and on the respective top surfaces of the active blocks 32, 34. A source ohmic contact 36 and a drain ohmic contact 38 may be formed that are positioned on different portions of the layer stack 14. The gate 28 and active blocks 32, 34 are positioned in a lateral direction between the source ohmic contact 36 and the drain ohmic contact 38. In an embodiment, the source ohmic contact 36 and the drain ohmic contact 38 may be formed in respective recesses that penetrate partially through the donor layer 24. The source ohmic contact 36 and the drain ohmic contact 38 may contain a mixture of polycrystalline grains that are comprised of aluminum, titanium, and silicon and polycrystalline grains that are comprised of aluminum. In an embodiment, the source ohmic contact 36 and the drain ohmic contact 38 may be formed by depositing a layer stack including layers of aluminum, titanium, and silicon, and performing a rapid thermal anneal to induce the formation of the polycrystalline grains.

In an embodiment, the source ohmic contact 36 and the drain ohmic contact 38 may represent respective terminals of the high-electron-mobility transistor. In an embodiment, the source ohmic contact 36 may represent a source terminal of the high-electron-mobility transistor and the drain ohmic contact 38 may represent a drain terminal of the high-electron-mobility transistor. The active blocks 32 are laterally positioned between the source terminal represented by the source ohmic contact 36 and the terminal represented by the gate 28. The active blocks 34 are laterally positioned between the drain terminal represented by the drain ohmic contact 38 and the terminal represented by the gate 28. The active blocks 32, 34 are considered active because they provide an additional terminal incorporated into the high-electron-mobility transistor embodied in the structure 10. More specifically, the active blocks 32, 34 are considered a fourth terminal of the high-electron-mobility transistor in addition to the source terminal, the drain terminal, and the terminal represented by the gate.

Figure 4:
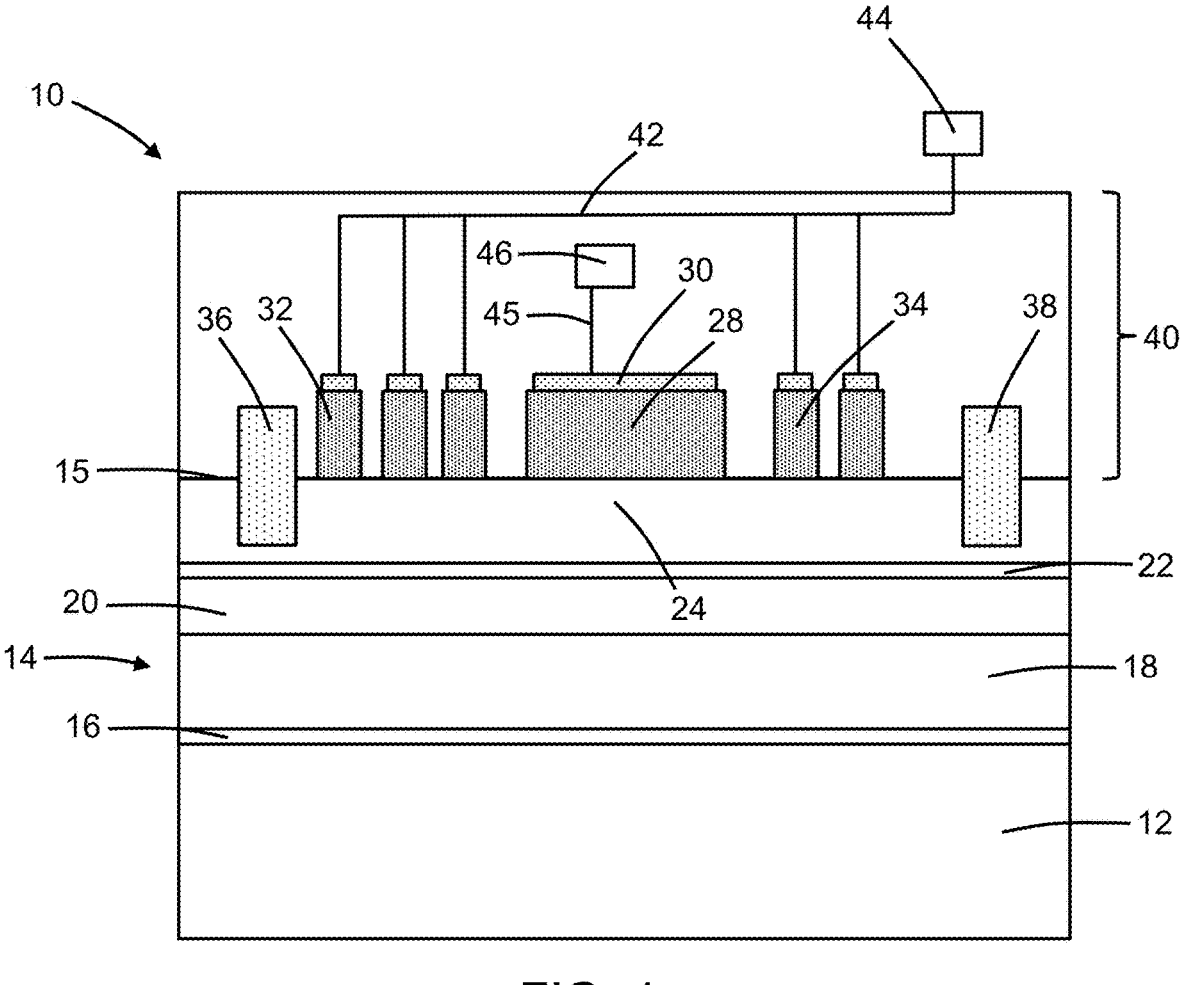
FIG. 4 is a cross-sectional view of the structure at a fabrication stage subsequent to FIG. 3.

With reference to FIG. 4 in which like reference numerals refer to like features in FIG. 3 and at a subsequent fabrication stage, an interconnect structure 40 may be formed that includes field plates, contacts, vias, and wiring that are coupled to the gate 28, the source ohmic contact 36, the drain ohmic contact 38, and the active blocks 32, 34 of the high-electron-mobility transistor. In an embodiment, the active blocks 32, 34 may be physically and electrically coupled by an electrical interconnection 42 in the interconnect structure 40 to a power supply 44, as diagrammatically shown in FIG. 4. The gate 28, the source ohmic contact 36, and the drain ohmic contact 38 may be electrically and physically isolated from the active blocks 32, 34. The gate 28 may be physically and electrically coupled by an electrical interconnection 45 within the interconnect structure 40 to a power supply 46. The electrical interconnection 45 is separate and distinct from the electrical interconnect 42. The power supply 46 may be configured to supply a control voltage or signal to the gate 28 that is different from the supply voltage supplied to the active blocks 32, 34 and that is different from ground.

The power supply 44 may be configured with circuitry to provide a supply voltage to the active blocks 32, 34 that controls the resistivity of the donor layer 24 and the two-dimensional electron gas. The power supply 44 may be variable and adjustable to provide multiple values of the supply voltage to the active blocks 32, 34 that are different from ground. In an embodiment, the power supply 44 may be located on the same chip as the high-electron-mobility transistor. In an alternative embodiment, the power supply 44 may be located on a different chip from the high-electron-mobility transistor. When the supply voltage supplied from the power supply 44 to the high-electron-mobility transistor is approximately equal to 0 volts, the supply voltage acts as a control over gate leakage and, at larger supply voltage values, may act to change the threshold voltage. Supply voltages greater than zero volts may introduce additional charge carriers into the two-dimensional electron gas, which may reduce the threshold voltage. Supply voltages less than zero volts may increase the threshold voltage by reducing the number of charge carriers.

The device structure embodied in the high-electron-mobility transistor may be configured to operate in enhancement mode with an applied voltage supplied from the power supply 44 to the active blocks 32, 34 providing adjustments to electrical parameters, such as the threshold voltage, the charge density in the two-dimensional electron gas and the related on-resistance, the gate leakage current, and/or the gate resistance. Each of the active blocks 32, 34 is characterized by a depletion width. The adjustments to the electrical parameters originate from a change in the depletion width under the active blocks 32, 34 with applied voltage. The active blocks 32, 34 may also improve the robustness of the high-electron-mobility transistor as a device structure.

Figure 5:
FIG. 5 is a top view of a structure in accordance with alternative embodiments of the invention.
Figure 5:
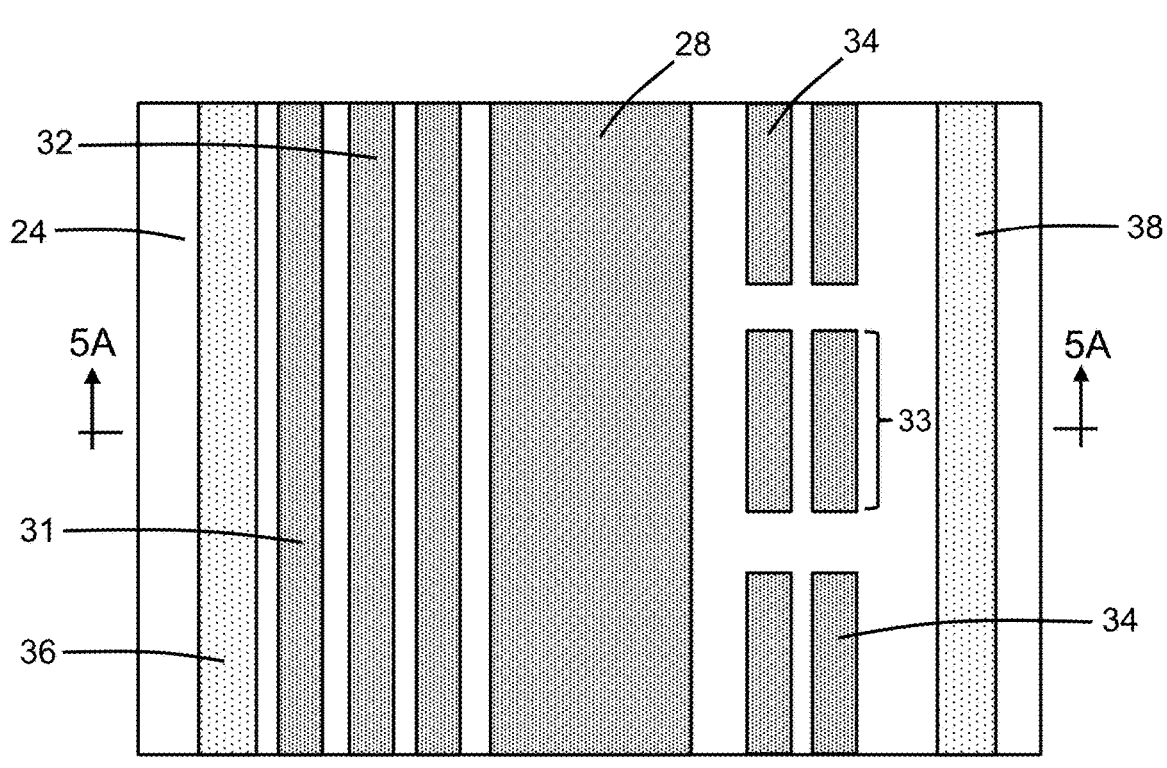
Figure 5A:
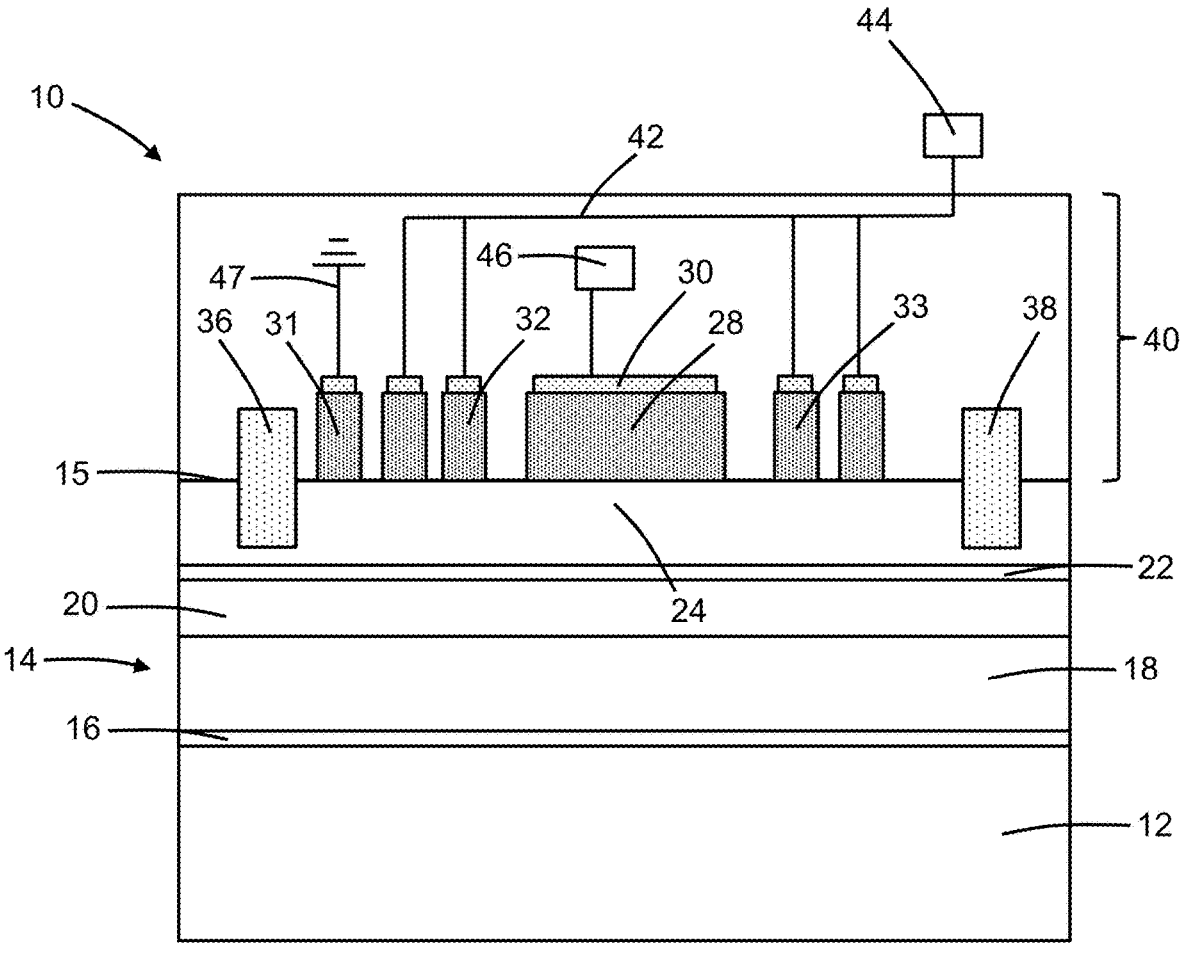
FIG. 5A is a cross-sectional view taken generally along line 5A-5A in FIG. 5 and in which the interconnect structure is shown.

With reference to FIGS. 5, 5A and in accordance with alternative embodiments, the active blocks 34 may be segmented into multiple sections 33, and the sections 33 of the active blocks 34 may all be coupled by the electrical interconnection 42 to the power supply 44 along with the non-segmented active blocks 32. The sections 33 of each active block 34 may be aligned in a row. In an alternative embodiment, the active blocks 32 may also be segmented into sections that are coupled by the electrical interconnection connection 42 to the power supply 44.

The structure 10 may include an inactive block 31 that is positioned on the top surface 15 of the layer stack 14 adjacent to the gate 28. In an embodiment, the inactive block 31 may be laterally positioned between the source terminal represented by the source ohmic contact 36 and the gate 28. In an embodiment, the inactive block 31 may be electrically and physically coupled by an electrical interconnection 47 in the interconnect structure 40 to ground. The inactive block 31 is considered inactive because it is not a terminal of the high-electron-mobility transistor. More specifically, the inactive block 31 is considered inactive because it is electrically isolated from the source terminal represented by the source ohmic contact 36, the drain terminal represented by the drain ohmic contact 38, the terminal represented by the gate 28, and the terminal represented by the active blocks 32, 34. In an alternative embodiment, multiple inactive blocks 31 may be incorporated into the structure 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a device structure including a gate and a first ohmic contact; and one or more first active blocks laterally positioned between the gate and the first ohmic contact, the one or more first active blocks configured to receive a supply voltage that is different from ground, wherein the one or more first active blocks and the gate comprise p-type gallium nitride.

2. The structure of claim 1 further comprising:

a substrate; and a layer stack on the substrate, the layer stack including a top surface and a plurality of semiconductor layers each comprising a compound semiconductor material, wherein the one or more first active blocks are positioned on the top surface of the layer stack.

3. The structure of claim 2 wherein the gate is positioned on the layer stack, and the first ohmic contact is coupled to the layer stack.

4. The structure of claim 2 wherein the device structure includes a second ohmic contact, the gate is laterally positioned between the first ohmic contact and the second ohmic contact, and further comprising:

one or more second active blocks positioned between the gate and the second ohmic contact, the one or more second active blocks configured to receive the supply voltage.

5. The structure of claim 4 wherein the one or more second active blocks comprise p-type gallium nitride.

6. The structure of claim 1 further comprising:

an inactive block adjacent to the gate; and an interconnect structure including an electrical interconnection configured to couple the inactive block to ground.

7. The structure of claim 6 wherein the inactive block is laterally positioned between the gate and the first ohmic contact.

8. The structure of claim 1 further comprising:

an interconnect structure including an electrical interconnection; and a power supply coupled by the electrical interconnection to the one or more first active blocks, the power supply configured to supply the supply voltage to the one or more first active blocks.

9. The structure of claim 1 wherein the one or more first active blocks and the gate further comprise a metal.

10. The structure of claim 1 further comprising:

an interconnect structure including a first electrical interconnection and a second electrical interconnection;

a first power supply coupled by the first electrical interconnection to the one or more first active blocks, the first power supply configured to supply the supply voltage to the one or more first active blocks; and a second power supply coupled by the second electrical interconnection to the gate, the second power supply configured to supply a control voltage to the gate that is different from the supply voltage and that is different from ground.

11. The structure of claim 1 wherein the gate has a gate length, and the one or more first active blocks have a width that is less than the gate length.

12. A structure comprising:

a device structure including a gate, a first ohmic contact, and a second ohmic contact, the gate laterally positioned between the first ohmic contact and the second ohmic contact;

one or more first active blocks laterally positioned between the gate and the first ohmic contact, the one or more first active blocks configured to receive a supply voltage that is different from ground; and one or more second active blocks positioned between the gate and the second ohmic contact, the one or more second active blocks configured to receive the supply voltage.

13. The structure of claim 12 wherein the one or more first active blocks and the one or more second active blocks comprise p-type gallium nitride, and the gate comprises p-type gallium nitride.

14. The structure of claim 12 further comprising:

an interconnect structure including an electrical interconnection; and a power supply coupled by the electrical interconnection to the one or more first active blocks and to the one or more second active blocks, the power supply configured to supply the supply voltage to the one or more first active blocks and to the one or more second active blocks.

15. The structure of claim 12 wherein the one or more first active blocks and the one or more second active blocks comprise a first material.

16. The structure of claim 15 wherein the gate comprises a second material different from the first material.

17. The structure of claim 16 wherein the first material is gallium nitride with a first concentration of p-type dopant, and the second material is gallium nitride with a second concentration of p-type dopant different from the first concentration of p-type dopant.

18. The structure of claim 15 wherein the gate comprises a second material identical to the first material.

19. The structure of claim 12 wherein the one or more first active blocks, the one or more second active blocks, and the gate further comprise a metal.

20. A method comprising:

forming a device structure that includes a gate and an ohmic contact; and forming one or more active blocks that are laterally positioned between the gate and the ohmic contact, wherein the one or more active blocks are configured to receive a supply voltage that is different from ground, and the one or more active blocks and the gate comprise p-type gallium nitride.

* * * * *